(12) United States Patent
Ji-Hai et al.

(10) Patent No.: US 6,860,321 B2
(45) Date of Patent: Mar. 1, 2005

(54) HEAT-DISSIPATING DEVICE

(75) Inventors: Tang Ji-Hai, Shen Zhen (CN); Zhang Min, Shen Zhen (CN)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/765,525

(22) Filed: Jan. 27, 2004

(65) Prior Publication Data

US 2004/0250993 A1 Dec. 16, 2004

(30) Foreign Application Priority Data

Jan. 30, 2003 (TW) .................................. 92201963 U

(51) Int. Cl.⁷ .............................................. F28F 7/00
(52) U.S. Cl. ................... 165/80.3; 165/104.33; 361/704
(58) Field of Search ................... 165/104.33, 80.2–80.4; 361/700, 704; 257/715

(56) References Cited

U.S. PATENT DOCUMENTS

| | | | | |
|---|---|---|---|---|
| 6,356,448 B1 | * | 3/2002 | DiBene et al. | 361/721 |
| 6,377,459 B1 | * | 4/2002 | Gonsalves et al. | 361/700 |
| 6,382,306 B1 | * | 5/2002 | Hsu | 165/80.3 |
| 6,397,926 B1 | * | 6/2002 | Sato et al. | 165/80.3 |
| 6,625,021 B1 | * | 9/2003 | Lofland et al. | 361/697 |
| 6,651,732 B2 | * | 11/2003 | Sagal | 165/80.3 |
| 6,745,824 B2 | * | 6/2004 | Lee et al. | 165/104.14 |

* cited by examiner

Primary Examiner—Paul J. Hirsch
(74) Attorney, Agent, or Firm—Robert J. Zeitler

(57) ABSTRACT

A heat-dissipating device for a heat generating electronic component has a heat-conducting plate having a holding surface, a heat sink defining a clipping holed formed at a bottom thereof and a heat-conducting block received in the clipping hole and disposed on the holding surface so that the heat-dissipating device has a good heat-dissipating efficiency.

8 Claims, 5 Drawing Sheets

HEAT-DISSIPATING DEVICE

FIELD OF THE INVENTION

The present invention relates to a heat-dissipating device, and more particularly to a heat-dissipating device disposed on a heat generating electronic component for heat dissipating.

DESCRIPTION OF THE RELATED ART

Current electronic components, such as CPUs or semiconductor packages used in computers or servers, have a high manipulation speed. Thus, when the electronic component is executed under full load, the temperature of its surface will be rather high even up to above 100 degree C. In order to dissipate heat generated by the electronic component, various heat dissipation modules, such as a fan or a heat sink with a bigger area, are mounted with the electronic components for dissipating the heat generated from the electronic components, so as to prevent the electronic components from being damaged due to overheat.

Referring to FIG. 1, a conventional heat-dissipating device has a heat-conducting plate 10, a heat-conducting block 11, a heat sink 12 and a fan 13. The heat-conducting plate 10 is a flat shape. The heat-conducting block 11 is a cylindrical heat pipe. The heat-conducting block 11 is vertically disposed on the heat-conducting plate 10.

The heat sink 12 has a plurality of fins 14 horizontally disposed on the heat-conducting plate 10. The heat-conducting block 11 is received in the fins 14 of the heat sink 12, so that the heat of the heat-conducting plate 10 is uniformly transmitted to the fins 14 of the heat sink 12 through the heat-conducting block 11.

The heat-conducting plate 10 is disposed on a heat generating electronic component (not shown) and suitably fixed. A heat of the heat generating electronic component is transmitted to the heat sink 12 through the heat-conducting block 11 for heat dissipating.

The fan 13 is disposed at a front side of the heat sink 12. When the fan 13 is driven, cool air flows to the fins 14 of the heat sink 12 for heat dissipating. Furthermore, heated air is discharged from a rear side of the heat sink 12.

However, the heat-conducting block 11 of the conventional heat-dissipating device is vertically disposed. When the fan 13 is driven, cool air does not flow to a rear side of the heat-conducting block 11 thereby causing stagnation of heated air. Heat of the fins 14 behind the heat-conducting block 11 is not effectively dissipated, so that a heat dissipating efficiency of the conventional heat-dissipating device is decreased.

Therefore, according to above descriptions, the conventional heat-dissipating device still has some inconvenient issues, which need to be improved.

SUMMARY OF THE INVENTION

The primary object of the present invention is to provide a heat-dissipating device with a better heat-dissipating efficiency, which does not cause stagnation of heated air.

Another object of the present invention is to provide a heat-dissipating device having a bigger contact area of the heat-conducting block and the heat sink, so that heat of the heat-conducting plate is effectively transmitted to the heat-conducting block and the heat sink.

In order to achieve the above objects, the present invention is to provide a heat-dissipating device. The heat-dissipating device has a heat-conducting plate having a holding surface, a heat sink defining a clipping hole formed at a bottom thereof, a heat-conducting block received in the clipping hole and disposed on the holding surface.

It is to be understood that both the foregoing general description and the following detailed description are exemplary, and are intended to provide further explanation of the invention as claimed.

Other advantages and features of the invention will be apparent from the following description, drawings and claims.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE DISCLOSED EMBODIMENTS

Figure 1:
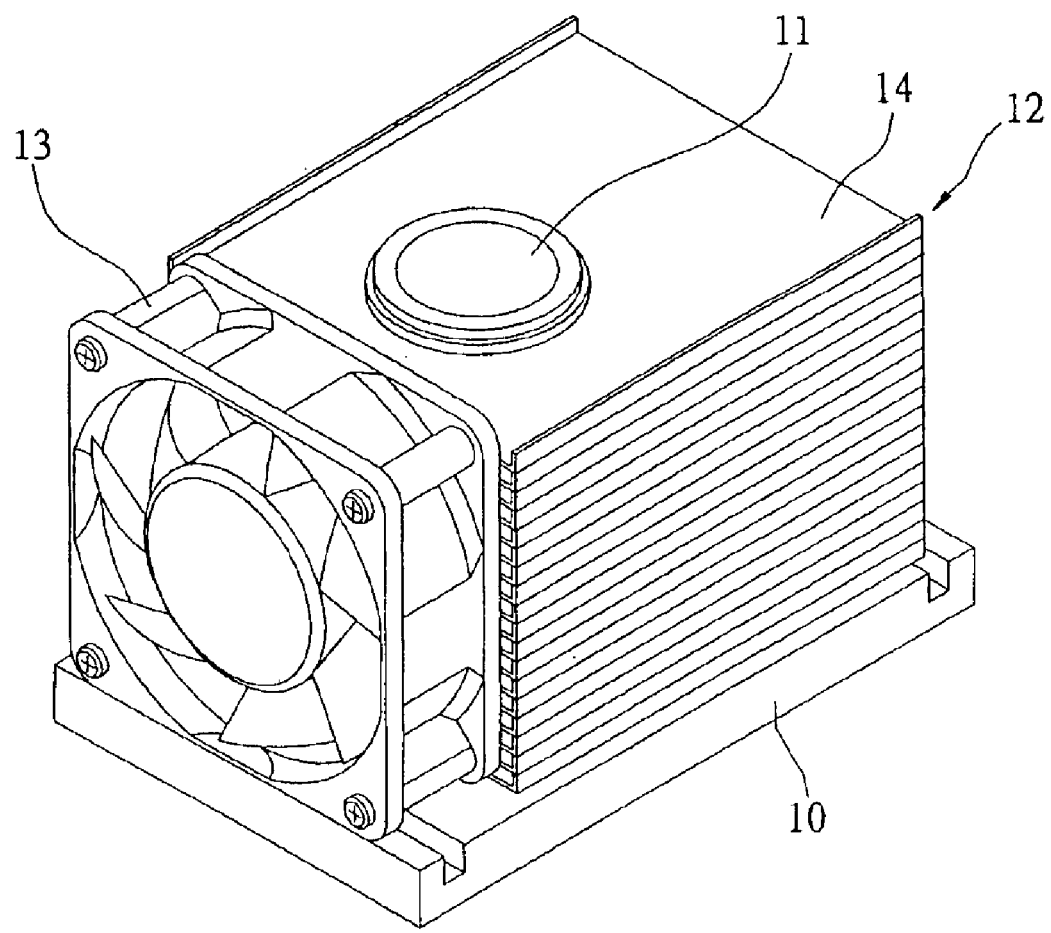
FIG. 1 is a perspective view of a conventional heat-dissipating device.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
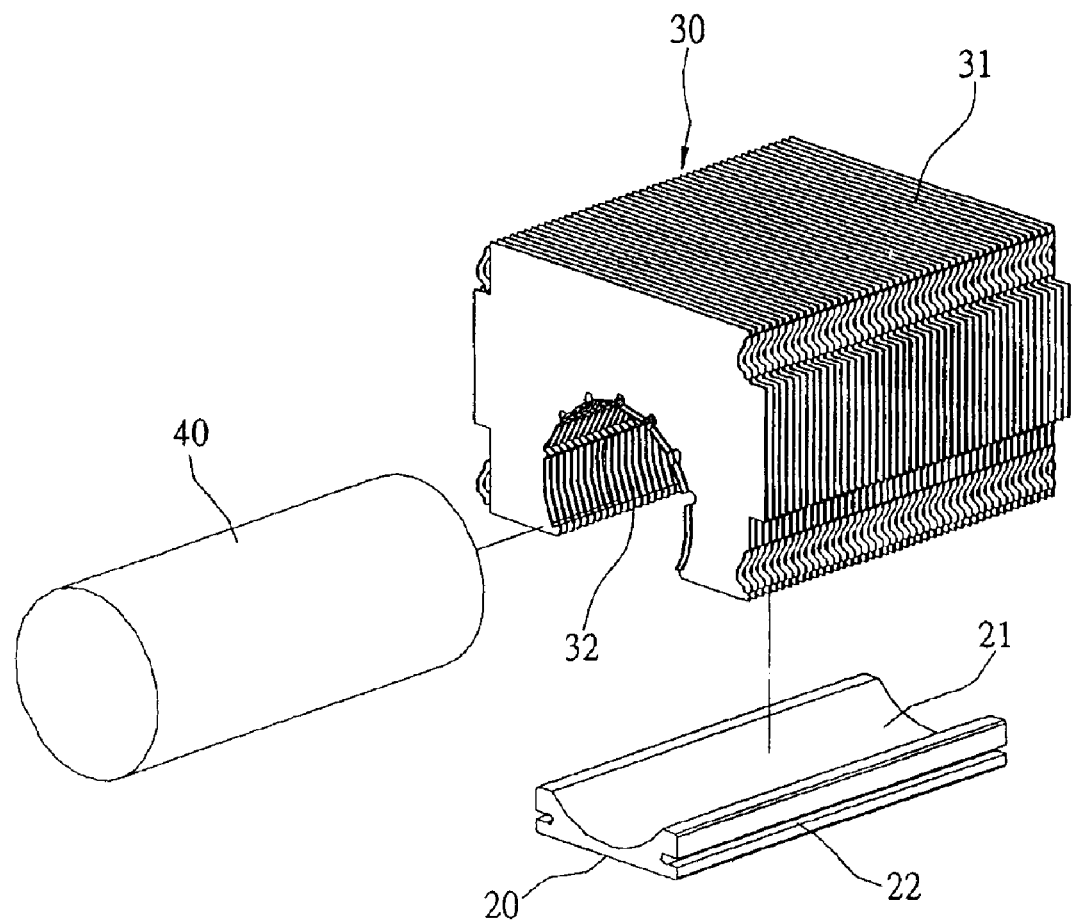
FIG. 2 is an exploded view of a heat-dissipating device in accordance with the present invention.
Figure 3:
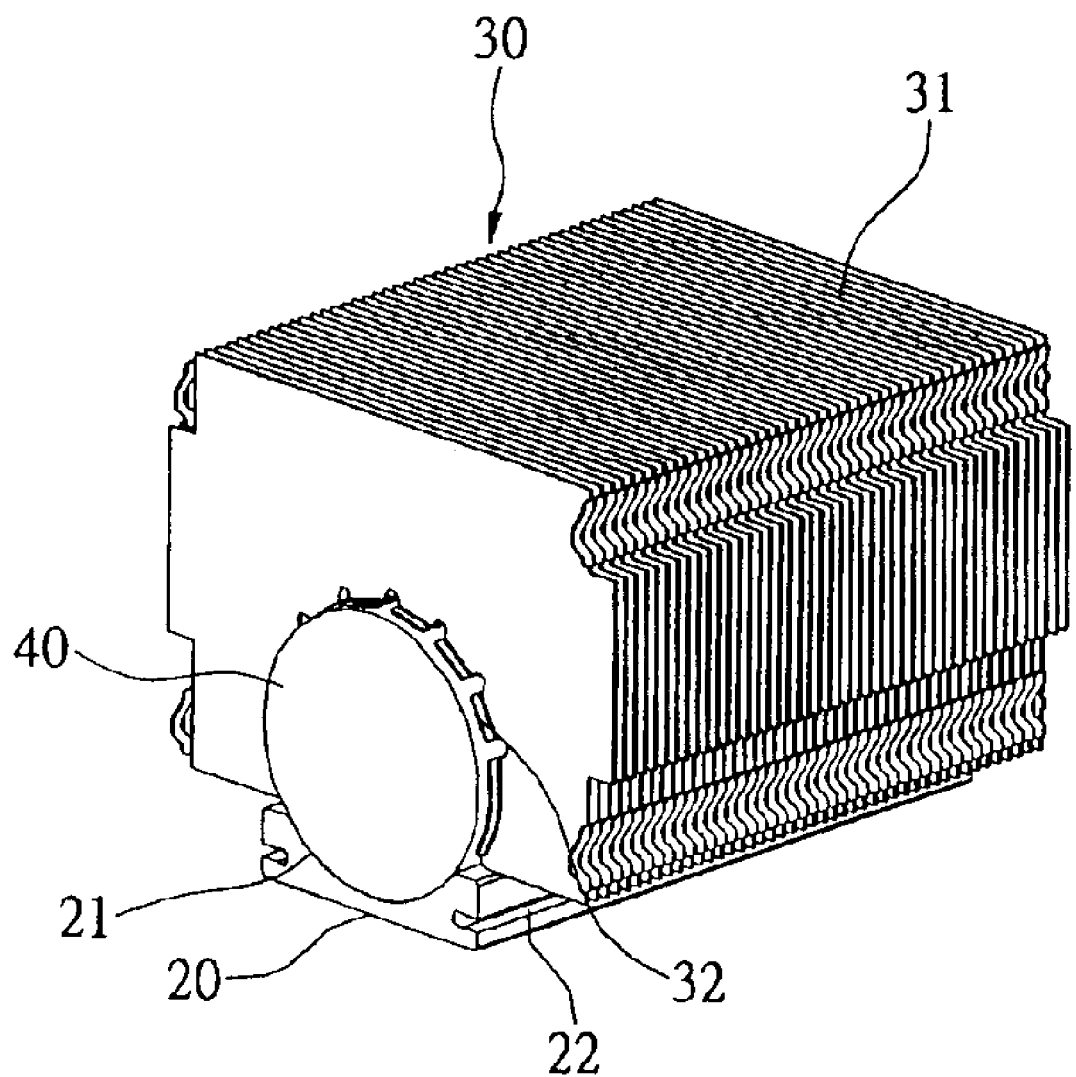
FIG. 3 is a perspective view of a heat-dissipating device in accordance with the present invention.

Referring to FIGS. 2 and 3, the present invention provides a heat-dissipating device having a heat-conducting plate 20, a heat sink 30 and a heat-conducting block 40.

The heat-conducting plate 20 is made of a metal material with good heat conduction. The heat-conducting plate 20 has a holding surface 21 formed on a top side thereof; moreover, the holding surface 21 of the heat conducting plate 20 is a concave shape corresponding to an exterior of the heat sink 30. Besides, the heat-conducting plate 20 further has two slots 22 formed on two opposite sides thereof. The bottom side of the heat conducting plate 20 is generally planar.

The heat sink 30 defining a clipping hole 32 formed at a bottom thereof wherein the clipping hole 32 of the heat sink 30 is defined from a front side of the heat sink 30 to a rear side of the heat sink 30. In the disclosed embodiment, the heat sink 30 has a plurality of fins 31 vertically disposed and arranged parallel to each other for air flowing. Each of the fins has its own clipping hole 32. Furthermore, the heat sink 30 is combined or integrally formed into one piece.

The heat-conducting block 40 is a generally cylindrical heat pipe. The heat-conducting block 40 is transversely received in the clipping hole 32 of the heat sink 30 and disposed on the holding surface 21 for heat dissipating.

The heat-conducting plate 20, the heat sink 30 and the heat-conducting block 40 are combined into one piece by welding or sintering, so that a heat of the heat-conducting plate 20 is uniformly transmitted to the fins 31 of the heat sink 30 through the heat-conducting block 40.

Figure 4:
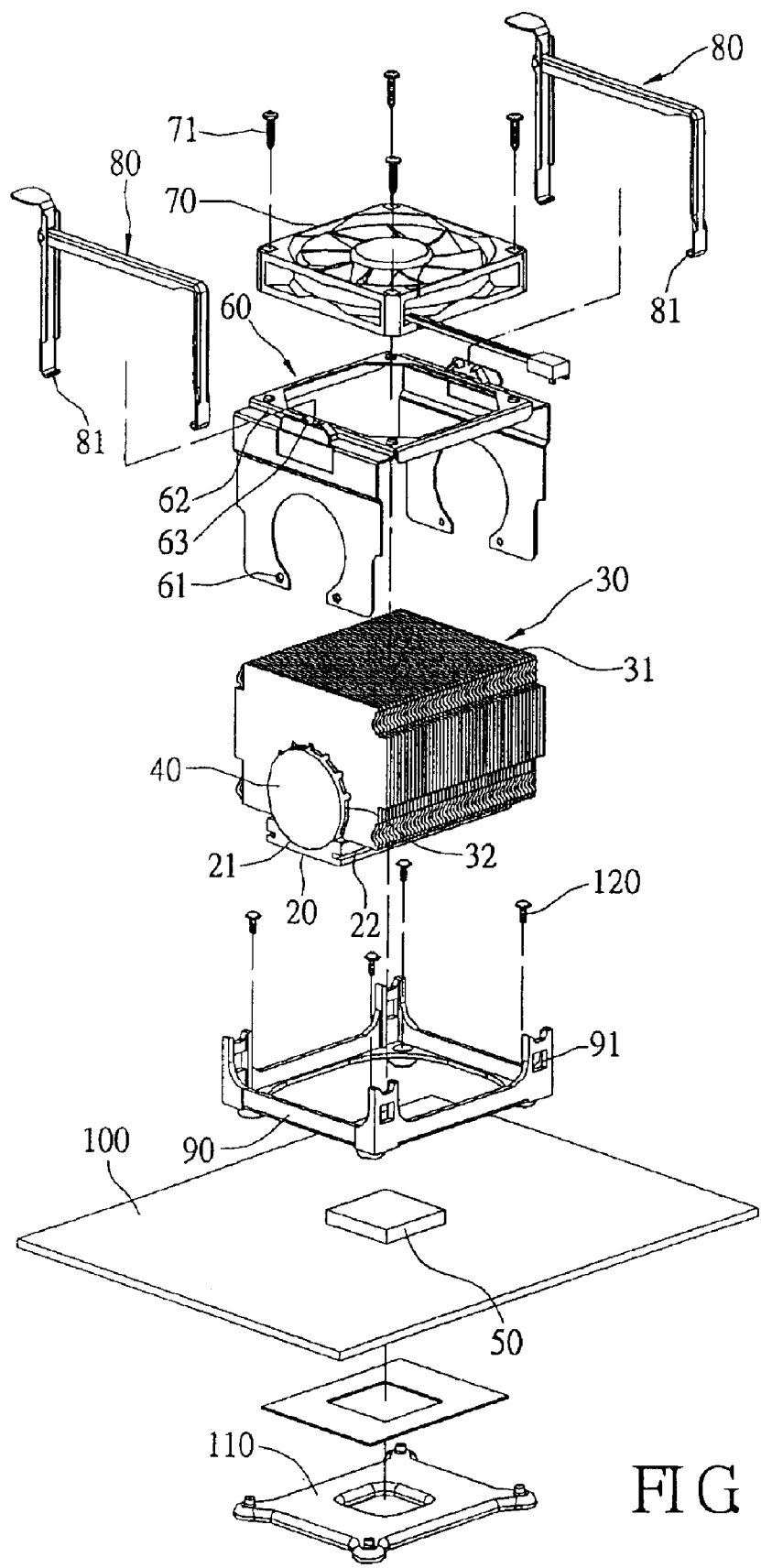
FIG. 4 is an exploded view that shows the heat-dissipating device in use.
Figure 5:
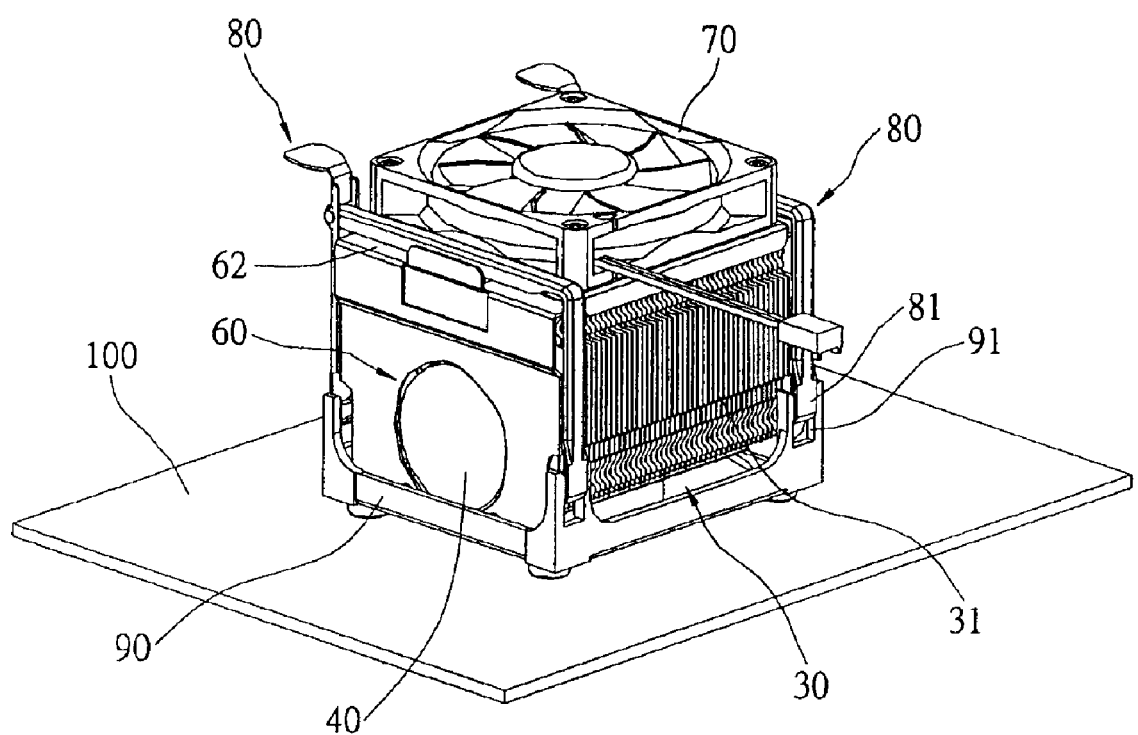
FIG. 5 is a perspective view that shows the heat-dissipating device in use.

Please referring to FIGS. 4 and 5, the heat-conducting plate 20 is disposed on a heat generating electronic component 50 and a bottom of the heat-conducting plate 20 is mated to a top of the heat generating electronic component 50, so that a heat of the heat generating electronic component 50 is transmitted to the fins 31 of the heat sink 30 through the heat-conducting block 40.

The heat-dissipating device further has a fixed base 90, a frame 60, a fan 70 and two clips 80. The fixed base 90 is disposed around a heat generating electronic component 50 on a printed circuit board 100, which receives the heat sink 30. Moreover, the fixed base 90 is fixed by a supporting base 110 and fixing parts 120.

The frame 60 is disposed around the heat sink 30, which has two shoulder portion 62 respectively formed at two opposite top sides thereof and two elastic elements 63 respectively disposed on the two shoulder portions 62. The frame 60 further defines two pairs of connecting holes 61 formed at two opposite bottom sides thereof, so that the frame 60 is screwed to the two slots 22 of the heat-conducting plate 20.

The fan 70 is fixed on the frame 60 by screws 71. The fixed base 90 further defines four hooked holes 91 formed at four corners thereof.

Each of the two clips 80 has two hooks 81 respectively hooking the four hooked holes 91 of the fixed base 90 to clip the fixed base 90 and press the two elastic elements 63 of the frame 60, so that the heat-conducting plate 20 abuts against the heat generating electronic component 50.

When the fan 70 is driven, cool air flows to the fins 31 of the heat sink 30 for heat dissipating. Furthermore, heated air is discharged from two side of the heat sink 30 for avoiding stagnation of heated air. Therefore, the fins 31 of the heat sink 30 have a good efficiency of heat dissipating.

Furthermore, the heat-conducting block 40 is transversely disposed on the holding surface 21, which has a bigger contact area. Consequently, the heat of the heat-conducting plate 20 is efficiently transmitted to the fins 31 of the heat sink 30 through the heat-conducting block 40, so as to has a good heat dissipating efficiency.

While a preferred embodiment of the present invention is shown and described, it is envisioned that those skilled in the art may devise various modifications of the present invention without departing from the spirit and scope of the appended claims.

What is claimed is:

1. A heat-dissipating device for an heat generating electronic component, comprising:
    a heat-conducting plate having a holding surface;
    a heat sink defining a clipping hole formed at a bottom thereof; and
    a heat-conducting block received in the clipping hole and disposed on the holding surface.

2. The heat-dissipating device as claimed in claim 1, wherein the heat sink has a plurality of fins vertically disposed and arranged parallel to each other for air flowing.

3. The heat-dissipating device as claimed in claim 1, wherein the clipping hole of the heat sink is defined from a front side of the heat sink to a rear side of the heat sink.

4. The heat-dissipating device as claimed in claim 1, wherein the holding surface of the heat-conducting plate is non-planar.

5. The heat-dissipating device as claimed in claim 1, wherein the heat-conducting block is a heat pipe.

6. The heat-dissipating device as claimed in claim 1, wherein the heat-conducting block is cylindrical.

7. The heat-dissipating device as claimed in claim 1, further comprising: a fixed base disposed around a heat generating electronic component on a printed circuit board and receiving the heat sink;
    a frame disposed around the heat sink and having two shoulder portion respectively formed at two opposite top sides thereof and two elastic elements respectively disposed on the two shoulder portions;
    a fan fixed on the frame; and
    two clips respectively clipping the fixed base and pressing the two elastic elements of the frame, so that the heat-conducting plate abuts against the heat generating electronic component.

8. The heat-dissipating device as claimed in claim 1, wherein the holding surface of the heat-conducting plate is a concave shape.

\* \* \* \* \*